United States Patent
Shafi

(10) Patent No.: US 7,238,577 B1
(45) Date of Patent: Jul. 3, 2007

(54) METHOD OF MANUFACTURING SELF-ALIGNED N AND P TYPE STRIPES FOR A SUPERJUNCTION DEVICE

(75) Inventor: Zia Alan Shafi, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 205 days.

(21) Appl. No.: 11/132,032

(22) Filed: May 18, 2005

(51) Int. Cl.
*H01L 21/336* (2006.01)

(52) U.S. Cl. ........... 438/268; 438/138; 438/157; 438/176; 438/181; 438/185; 438/188; 438/197; 438/514; 438/286; 257/E21.336; 257/E21.346

(58) Field of Classification Search .............. None
See application file for complete search history.

(56) References Cited

U.S. PATENT DOCUMENTS

| | | | |
|---|---|---|---|
| 5,216,275 A | 6/1993 | Chen | 257/493 |
| 6,512,267 B2 | 1/2003 | Kinzer et al. | 257/335 |
| 6,528,849 B1 | 3/2003 | Khemka et al. | 257/342 |
| 6,576,935 B2 * | 6/2003 | Onishi et al. | 257/124 |
| 6,621,122 B2 | 9/2003 | Qu | 257/339 |
| 6,673,679 B1 * | 1/2004 | Miyasaka et al. | 438/268 |
| 6,768,180 B2 | 7/2004 | Salama et al. | 257/401 |
| 6,787,872 B2 | 9/2004 | Kinzer et al. | 257/492 |
| 6,835,993 B2 | 12/2004 | Sridevan et al. | 257/492 |

* cited by examiner

*Primary Examiner*—Michael Lebentritt
*Assistant Examiner*—Kyoung Lee
(74) *Attorney, Agent, or Firm*—Stallman & Pollock LLP

(57) ABSTRACT

A method is provided for obtaining extremely fine pitch N-type and P-type stripes that form the voltage blocking region of a superjunction power device. The stripes are self-aligned and do not suffer from alignment tolerances. The self-aligned, fine pitch of the alternating stripes enables improvements in on-state resistance, while ensuring that the superjunction device is fully manufacturable. Only one masking step is required to fabricate the alternating N-type and P-type stripes.

5 Claims, 3 Drawing Sheets

METHOD OF MANUFACTURING SELF-ALIGNED N AND P TYPE STRIPES FOR A SUPERJUNCTION DEVICE

TECHNICAL FIELD

The present invention relates to integrated circuit structures and, in particular, to a method for economically fabricating extremely fine pitch, self-aligned, alternating n-type and p-type stripes that form the voltage blocking region of a superjunction power device.

DESCRIPTION OF THE INVENTION

As discussed in U.S. Pat. No. 5,216,275, which issued on Jun. 1, 1993, it is well known that, in conventional semiconductor power devices, the reverse voltage applied across the n+ region(s) and p+ region(s) is sustained by a lightly doped semiconductor layer, typically referred to as the voltage sustaining layer. For high voltage power devices, the on-resistance of the device is determined primarily by the voltage sustaining layer, since the breakdown voltage of the device depends primarily on the doping concentration and thickness of this layer. The lower the doping concentration and/or the greater the thickness of the voltage sustaining layer, the higher the breakdown voltage, but also the higher the on-resistance.

The '275 patent discloses the utilization of a so-called composite buffer layer just below the active region of a superjunction power device for a vertically configured device, or adjacent to the active region for a laterally configured device. The composite buffer layer contains alternating regions with opposite conductivity types, i.e. alternatingly arranged n-type regions and p-type regions, that improve the relationship between the breakdown voltage and the on-resistance of the device.

Figure 1:
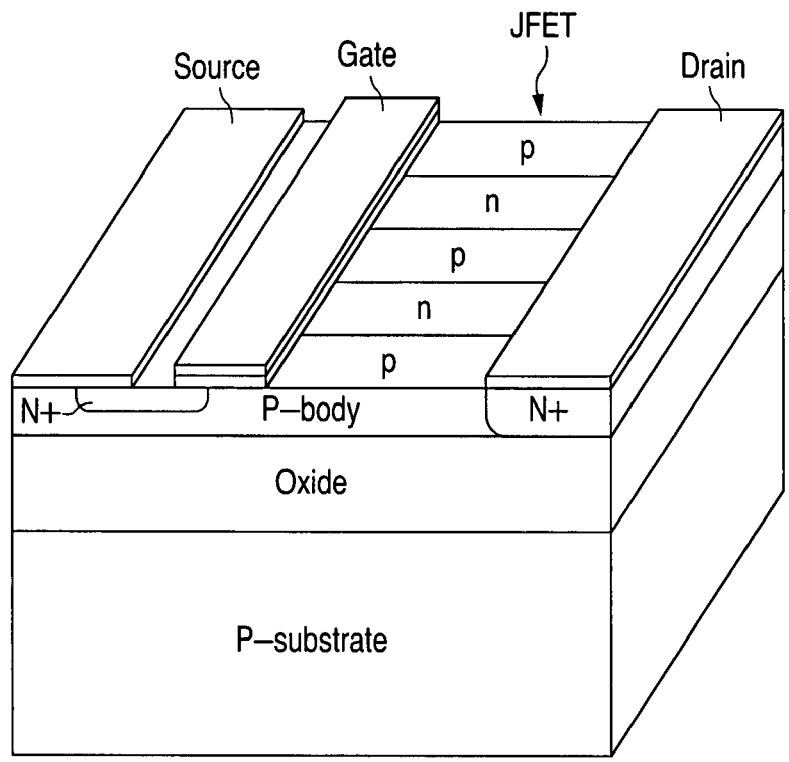
FIG. 1 is a schematic drawing illustrating alternating n-type and p-type stripes in a conventional superjunction power device.

Xu et al., "120 V Interdigitated-Drain LDMOS (IDLD-MOS) on SOI Substrate Breaking Power LDMOS Limit", IEEE Transactions on Electron Devices, Vol. 47, No. 10, October 2000, disclose a device structure of the type discussed in the '275 patent. The Xu et al. device, shown in FIG. 1, replaces the n-drift region of a conventional LDMOS device with an alternating p-type and n-type JFET region. Lateral depletion of the interdigitated pn junctions results in complete depletion of the JFET region.

Although superjunction power device structures of the type disclosed in the '275 patent and in the Xu et al publication are well known, it would be highly desirable have available a low cost method of fabricating fine pitch n-type and p-type stripes for utilization in these structures. Xu et al. demonstrate that the finer the pitch, the lower the on-state resistance obtainable for a given breakdown voltage.

The present invention provides a method for fabricating extremely fine pitch, alternating n-type and p-type stripes that form the voltage blocking region of a superjunction device. The stripes are self-aligned and do not suffer from alignment tolerances. The self-aligned fine pitch enables improvements in on-state resistance, while ensuring that the device is fully manufacturable. In contrast with past fabrication techniques for these structures, only one masking step is required to fabricate the n-type and p-type stripes.

An embodiment of a method of fabricating fine-pitch, self-aligned n-type and p-type stripes for a superjunction device will now be described in conjunction with the partial cross-section drawings provided in FIGS. 2A-2H. Those skilled in the art will appreciate that the specific details (e.g. material choice, layer thickness, dopant concentration, etc.) of a particular structure in accordance with the invention will depend upon the device application. Those skilled in the art will also appreciate that the method described below in conjunction with FIGS. 2A-2H is general in its reference to conductivity types, but would apply to either NMOS or PMOS superjunction devices.

Figure 2A:
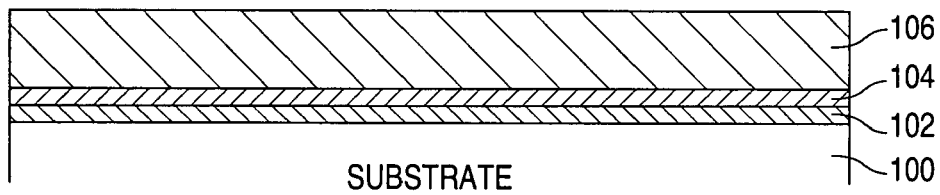
FIGS. 2A-2H are partial cross-section drawings illustrating a sequence of steps of an embodiment of a method of manufacturing fine pitch, self-aligned n-type and p-type stripes for a superjunction power device in accordance with the concepts of the present invention.

With reference to FIG. 2A, a method in accordance with the present invention includes the formation of a layer of etch-stop material 102 on an underlying semiconductor substrate 100. Typically, the substrate 100 will be crystalline silicon and the layer of etch-stop material will be a dielectric material, preferably thermally grown silicon dioxide approximately 500 Angstroms thick. A layer 104 of dielectric material, e.g. silicon nitride approximately 500 Angstroms thick, is then formed on the underlying layer of etch-stop material 102. As shown in FIG. 2A, a thicker layer 106 of dielectric material, e.g. silicon dioxide approximately 8000 Angstroms thick, is deposited on the dielectric layer 104. As will become clear from the discussion that follow, the etch-stop material 102 is selected to have favorable etch-stop properties with respect to the etching of the overlying dielectric material layers 104, 106.

Figure 2B:
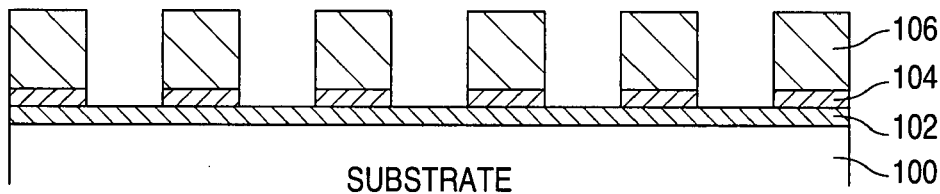

Referring now to FIG. 2B, a photoresist mask (not shown) is formed over the FIG. 2A structure and patterned to expose space-apart surface regions of the upper layer 106 of dielectric material. The photoresist mask is then utilized to etch both the upper dielectric layer 106 and the underlying dielectric layer 104 in a dry-etch process that stops on the layer of etch-stop material 102, resulting in the structure shown in FIG. 2B.

Figure 2C:
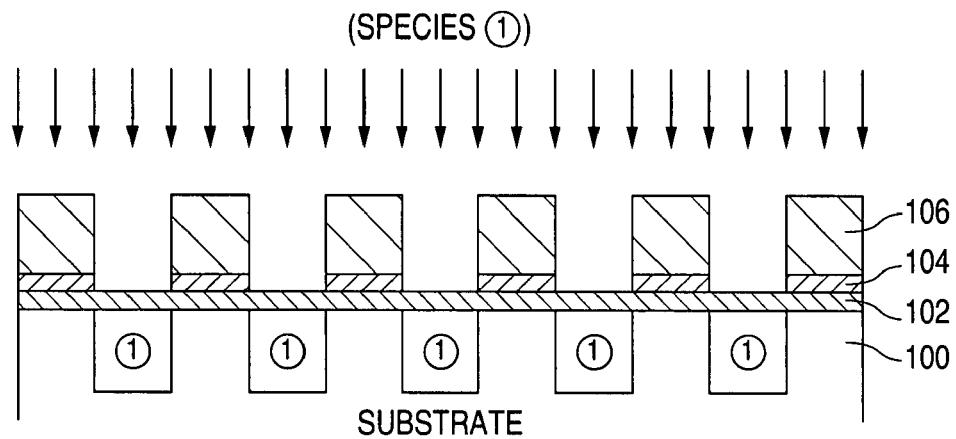

Next, as shown in FIG. 2C, a first dopant species having a first conductivity type (n-type or p-type) is implanted into the semiconductor substrate 100 beneath the exposed surface region stripes of the etch-stop material 102 to define a plurality of space-apart stripes 107 having the first conductivity type in the semiconductor substrate 100.

Figure 2D:
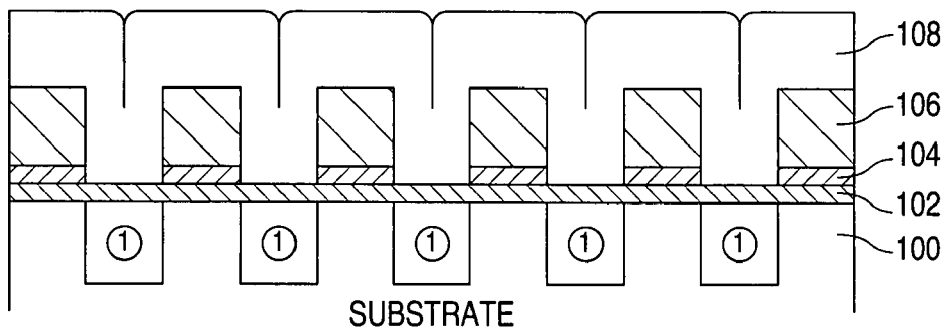

Next, referring the FIG. 2D, a layer 108 of conformal material, preferably polysilicon (or silicon nitride), is deposited over the FIG. 2C structure such that the conformal material 108 fills the trenches formed between the "pillars" of first and second layers of dielectric material 104, 106 that remain after the dry etch step described above.

Figure 2E:
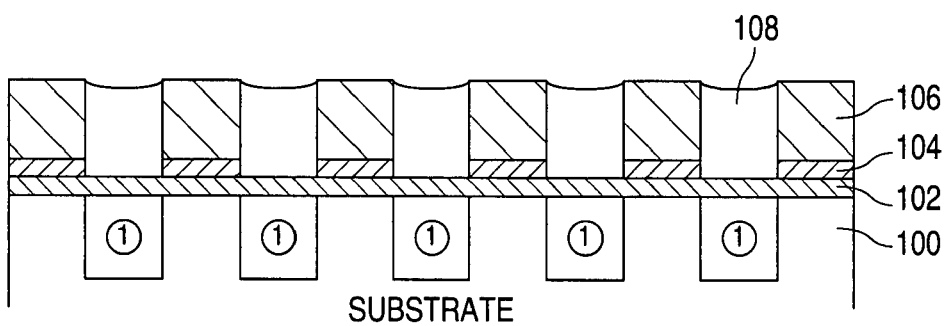

The conformal material 108 is then planarized by, for example, by etching the conformal material 108 back or chemically mechanically polishing (CMP) the conformal material 108 to the top surface of the remaining dielectric "pillars", as shown in FIG. 2E.

Figure 2F:
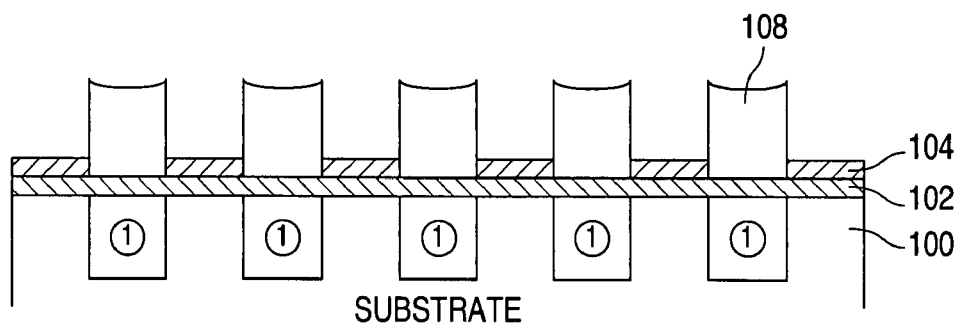

Referring to FIG. 2F, the remaining dielectric material 106 is then removed to expose a plurality of space-apart surface region stripes of the remaining dielectric material 104.

Figure 2G:
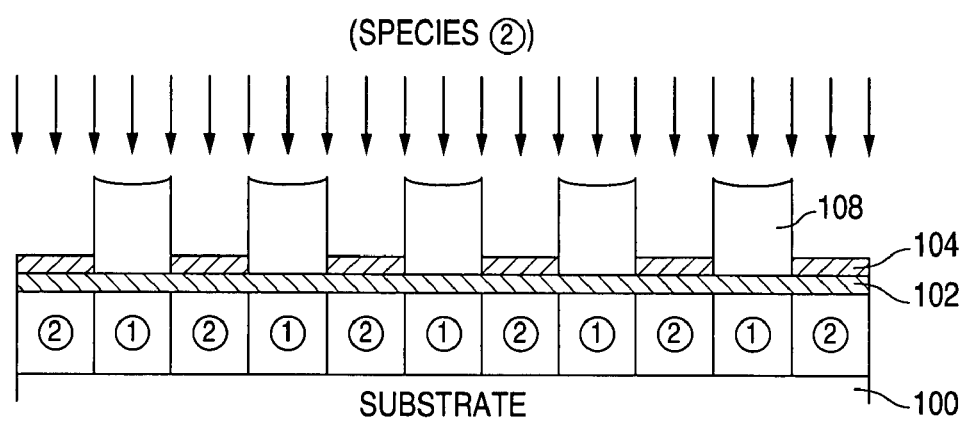

Referring to FIG. 2G, a second dopant species having a second conductivity type (p-type or n-type) that is opposite the conductivity of the first dopant species, is then introduced into the semiconductor substrate 100 beneath the exposed surface region stripes of the dielectric material 104 to define a plurality of space-apart stripes 109 having the second conductivity type in the semiconductor substrate 100, thereby defining a substrate structure that comprises a plurality of adjacent substrate stripes that alternate between substrate stripes 107 having the first conductivity type and substrate stripes 109 having the second conductivity type.

Figure 2H:
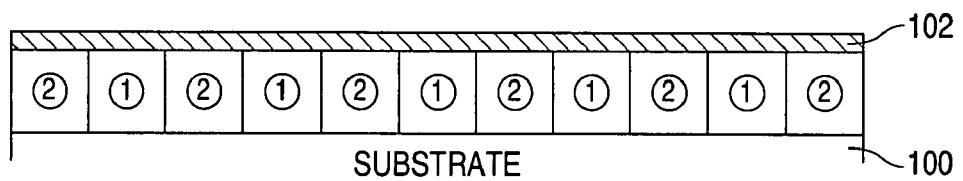

The remaining conformal material 108 is then stripped, as is the remaining dielectric material 104, resulting in the structure shown in FIG. 2H.

It should also be understood that the particular embodiments of the invention described above have been provided by way of example and that other modifications may occur to those skilled in the art without departing from the scope and spirit of the invention as expressed in the appended claims and their equivalents.

What is claimed is:

1. A method of fabricating a semiconductor power device structure, the method comprising:

forming a layer of etch stop material on a semiconductor substrate;

forming a first layer of dielectric material on the layer of etch stop material;

forming a second layer of dielectric material on the first layer of dielectric material;

patterning the first and second layers of dielectric material to form trenches therein to expose a plurality of spaced-apart surface region stripes of the etch stop material;

introducing dopant having a first conductivity type into the semiconductor substrate beneath the exposed surface region stripes of the etch stop material to define a plurality of space-apart stripes having the first conductivity type in the semiconductor substrate;

forming a layer of conformal material over the structure resulting from the foregoing steps such that the conformal material fills the trenches formed in the first and second layers of dielectric material;

planarizing the layer of conformal material to a top surface of remaining second dielectric material;

removing the remaining second dielectric material to expose a plurality of spaced-apart surface region stripes of the first dielectric material;

introducing dopant having a second conductivity type that is opposite the first conductivity type into the semiconductor substrate beneath the exposed surface region stripes of the first dielectric material to define a plurality of space-apart stripes having the second conductivity type in the semiconductor substrate, thereby defining a substrate structure that comprises a plurality of adjacent substrate stripes that alternate between substrate stripes having the first conductivity type and substrate stripes having the second conductivity type;

removing remaining conformal material; and removing remaining first dielectric material.

2. A method as in claim 1, and wherein the etch stop material comprises silicon oxide.

3. A method as in claim 2, and wherein the first dielectric material comprises silicon nitride.

4. A method as in claim 3, and wherein the second dielectric material comprises silicon oxide.

5. A method as in claim 4, and wherein the conformal material comprises polysilicon.

* * * * *